US005178802A

United States Patent [19]

Cree et al.

[11] Patent Number: 5,178,802

[45] Date of Patent: Jan. 12, 1993

[54] SURFACE TREATMENT OF POLYOLEFIN OBJECTS

[76] Inventors: Stephen H. Cree, 3/4 White Park, Gorgie Rd., Edinburgh, United Kingdom; Hendrikus J. J. Rutten, Zwanenstraat 17, 6211 BP, Maastricht, Netherlands

[21] Appl. No.: 601,007

[22] Filed: Oct. 22, 1990

Related U.S. Application Data

[63] Continuation of Ser. No. 257,943, Oct. 14, 1988, abandoned.

[30] Foreign Application Priority Data

Oct. 14, 1987 [NL] Netherlands ........................ 8702448

[51] Int. Cl.[5] ....................... B29C 71/00; D01F 11/00

[52] U.S. Cl. ..................................... 264/22; 264/129; 264/204; 264/205; 264/210.1; 264/210.8; 264/340

[58] Field of Search ............. 156/314; 264/205, 210.3, 264/210.8, 129, 22, 204, 210.1, 340

[56] References Cited

U.S. PATENT DOCUMENTS 4,046,843 9/1977 Saro et al. ............................ 264/22
4,609,420 9/1986 Azdin et al. ....................... 156/314

FOREIGN PATENT DOCUMENTS 0062491 10/1982 European Pat. Off. .
0144997 6/1985 European Pat. Off. .
0181016 5/1986 European Pat. Off. .
2164897 4/1986 United Kingdom .

*Primary Examiner*—Leo B. Tentoni
*Attorney, Agent, or Firm*—Cushman, Darby & Cushman

[57] ABSTRACT

The adhesion of polyolefin objects, in particular highly oriented polyethylene filaments, to, for instance, polar matrices is improved by oxidizing the surface of the objects and then treating it with a solution of a silane compound, a titanate or a chromium complex.

9 Claims, No Drawings

SURFACE TREATMENT OF POLYOLEFIN OBJECTS

This is a continuation of application Ser. No. 07/257,943, filed on Oct. 14, 1988, which was abandoned upon the filing hereof.

The invention relates to a process for the treatment of surfaces of polyolefin objects.

Polyolefins are nonpolar polymers that have been known for a long time and which can be, and are, used for a large number of purposes. A number of applications consist in combining polyolefins with other substances (or plastics), for example in multi-layer films or composites, or applying an adhesive, ink or paint layer or a coating to an object manufactured from a polyolefin. Use is often made of materials with a polar character in these applications. A problem in such applications is the nonpolarity of the polyolefins, on account of which it is very difficult to obtain good adhesion between the non-polar polyolefin and materials that are more polar than the polyolefin, for example polar substances (or plastics), resins and metals.

Various solutions to this problem have been suggested, for example treating the polyolefin object with oxidizing liquids such as chromic acid (so-called etching) or subjecting it to a plasma discharge treatment as described in EP-A-62.491. However, these methods are complicated or expensive, or the strength and the stiffness of the polyolefin material are affected while, moreover, the adhesion is often unsatisfactory.

The aim of the invention is to find a process for treating polyolefin surfaces to obtain good adhesion to materials of a more polar nature than the polyolefin without the aforementioned disadvantages.

The invention relates to a process for the treatment of the surface of polyolefin objects which is characterized in that the surface of the object is oxidized and contacted with a solution of a silane compound, a titanate or chromium complex.

In particular the invention relates to a process for treating the surface of highly oriented polyolefin objects, which objects are obtained by converting a solution or melt of a linear polyolefin with a weight average molecular weight of at least 400,000 g/mol, at a temperature above the dissolution temperature or above the melting temperature, respectively, into a shape, cooling this to form a solid, gel-like object and stretching this object, at increased temperature, whether or not after complete or partial removal of the solvent.

The oxidation of the surface can be effected in different ways, for example by treatment with very powerful oxidizing agents, or by plasma or corona treatment.

Preferably a corona treatment as described in, for example, EP-A-144.997 is effected to this end.

As silane compound an alkoxy substituted silane compound, such as 3-aminopropyltriethoxysilane, 3-trimethoxysilylpropyl methacrylate, triethoxyvinylsilane, 3-glycidoxypropyltrimethoxysilane or trimethoxysilylpropylethylenediamine, is preferably used.

As titanate tetraisopropyl titanate, isopropyltri(-dodecylbenzenesulphonyl) titanate, isopropyltri(laurylmyristyl) titanate, tetraisopropyldi(dioctyl phosphito) titanate, isopropyldi(dodecylbenzene sulphonyl-4-aminobenzenesulphonyl titanate, isopropyltri(diisooctyl phosphato)titanate, isopropylisostearoyl di(4-aminobenzoyl) titanate, isopropyltri(dioctyl pyrophosphato)-titanate, titanium isostearate methacrylate oxyacetate, isopropyltriisostearoyl titanate, ethylene isostearate methacrylate titanate, isopropyl isostearoyl dimethacryl titanate may, for example, be used. As chromium complex trivalent chromium complexes with carboxyl ligands may, for instance, be added.

Various solvents known per se may be used as solvent. The choice of the solvent depends on the solubility and the polarity of the compound. Preferably use is made of a polar solvent such as water, lower aliphatic ketones, alkanols, or carboxylic esters, such as acetone, methanol, ethanol, ethylacetate, and the like.

The concentration of the solution to be used is preferably between 0.05 and 20 wt % of the compound, based on the total solution, in particular 0.1–5%.

The amount of compound used is preferably such that, immediately after it has been contacted with the compound, the object contains $1\text{–}20\times10^{-4}$ mg, in particular $4\text{–}15\times10^{-4}$ mg of compound per $cm^2$ of surface area. This amount also depends somewhat on the solubility and the polarity of the compound.

The temperature at which the polyolefin surface is brought into contact with the solution of the compound may vary and depends on the reactivity of the compound used. Preferably, ambient temperature is applied.

The polyolefin object and the solution of the compound can be contacted by, for example, immersing the polyolefin object in, or passing it through, the solution of the compound, by applying the solution of the compound with a brush, or by spraying the polyolefin object with the solution of the compound.

A great advantage of the process according to the invention is that the treatment may also be effected locally, for example by partial immersion, or by only brushing or spraying the part where adhesion is required without impairing the original properties of the remaining part of the surface.

Polyolefin objects treated according to the invention, such as filaments, tapes, films, can easily be glued, painted, lacquered, coated with ink, or provided with a layer of material that is more polar than the polyolefin, etc. These treatments are known per se. The objects treated appeared to retain their adhesive strength for a long time. Even after storage for more than three months the adhesive strength of the objects treated according to the invention appeared to be hardly less than immediately after treatment.

Polyolefin objects treated according to the invention adhere well to materials with a polar character, such as resins and polyamides or rubbers. This is of particular importance for example in composites: materials (the so-called matrix) reinforced with other, often fibrous, materials.

When polyolefin filaments are treated according to the invention they become extremely suitable for use as reinforcing material in composites, because the adhesion between the filament and the matrix improves considerably.

These filaments may be incorporated into polar matrices in a manner known per se, for example by impregnation of fabrics or by winding. (A general survey of techniques commonly applied to this end is given in the 'Handbook of Composites ' by Luben, G., published in 1982 by Van Nostrand Reinhold Co. (New York)).

Polyolefin filaments treated according to the invention are particularly suitable for reinforcing polar polymeric materials such as epoxy, phenolic, vinyl ester, polyester, acrylate, cyanoacrylate, polymethyl methacrylate resins and polyamide materials and rubbers. Preferably an epoxy resin, nylon or an unsaturated polyester is used as matrix.

The composites thus obtained have a very wide range of technical applications, for example in boats, surf boards, (glider) aircraft parts, printed circuit boards and car parts, such as bonnets, mudguards, etc.

Preferably, highly oriented polyolefin (polyethylene) objects, such as filaments, tapes or films are used. These can be prepared using solutions of a high-molecular polyolefin as starting material, see for instance U.S. Pat. No. 4,344,908, U.S. Pat. No. 4,411,854, U.S. Pat. No. 4,422,993, U.S. Pat. No. 4,430,383, U.S. Pat. No. 4,436,689, U.S. Pat. No. 4,668,717, GB-A-2164.897 and EP-A-181.016. In these patents a solution of a linear polyolefin with a weight average molecular weight of at least $4\times10^5$ g/mol is spun or extruded, the object obtained after spinning or extrusion is converted into a gel object by cooling, and this gel object is stretched at increased temperature. It is also known to prepare such objects using a melt of a polyolefin as staring material, see for example U.S. Pat. No. 4,525,564.

In particular, highly oriented polyolefin (polyethylene) filaments which have been obtained by ultradrawing gel filaments spun from a solution (draw ratio more than 20) and which have an extremely high tensile strength, for example in the case of polyethylene more than 2 GPa, and an extremely high modulus, for example more than 50 GPa, are used as polyolefin objects.

As high-molecular linear polyolefin polyethylene with a weight average molecular weight of at least $4\times10^5$ g/mol, especially of at least $6\times10^5$ g/mol, is preferably used, which may contain minor amounts, preferably at most 5 mole %, of one or more other alkenes copolymerised with it, such as propylene, butene, pentene, hexene, 4-methylpentene, octene, etc., with the polymer chains consisting of unbranched carbon chains of at least 100 carbon atoms, preferably at least 300 carbon atoms, between carbon atoms with side chains of more than 1 C atom. Preferably a polyethylene containing 2-30, in particular 3-12, methyl or ethyl side groups per 1000 carbon atoms is used. The polyethylene may contain minor amounts, preferably at most 25 wt % based on the total polymer, of one or more other polymers, in particular an alkene-1-polymer such as polypropylene, polybutene or a copolymer of propylene with a minor amount of ethylene. In addition, a poly-propylene or ethylenepropylene copolymer may be used as high-molecular linear polyolefin.

The invention will now be elucidated with an example, without, however, being limited thereto.

EXAMPLE

A polyethylene fibre (Mw$=1.9\times10^6$ g/mol) with a modulus of 109 GPa, a tensile strength of 2.4 GPa, and 800 dtex, obtained according to the process described in U.S. Pat. No. 4,668,717, was subjected to a corona treatment according to the process described in EP 144.997 and subsequently drawn through a 1.0 wt % solution of 3-aminopropyltriethoxysilane in water, at room temperature. The contact time of the fibre and the solution was about 30 seconds. Subsequently, the fibre was dried in a flow of hot air. The tensile strength and modulus of the treated fibres was about 95% of that of the untreated fibres.

An amount of treated fibre was incorporated into an epoxy resin (100 parts of Europox 730 supplied by Schering, 83 parts of phthalic anhydride and 0.3 parts of benzyldimethylamine) in a ratio of 50 vol % fibre and 50 vol % resin. This mixture was shaped into a 150 mm long, 3 mm high and 4 mm wide test rod. The composite was cured at 80° C. for 5 hours and at 120° C. for 15 hours. The test rod was then sawn into 18 mm long test pieces.

The ILLS (interlaminar shear strength) of these test pieces was measured with a testing speed of 1 mm/min according to the ASTM 3 point bending test D 2344. For the purpose of comparison, the ILLS was also determined of test pieces prepared according to the above-mentioned process and composed of the aforementioned epoxy resin and untreated fibre and corona-treated fibre, respectively.

The results are presented below.

| Fibre | ILLS (MPa) |
|---|---|
| Untreated | 12.5 ± 0.7 |
| Corona treated (250 W; 25 m/min) | 19.5 ± 1.0 |
| Corona treated (250 W; 25 m/min) + silane | 25.5 ± 1.5 |

We claim:

1. Process for the treatment of surfaces of polyolefin objects which substantially retains the tensile strength of the object, wherein the surface of the object is oxidized by corona treatment and subsequently contacted with a solution comprising a silane compound.

2. Process according to claim 1, wherein said polyolefin object is a highly oriented polyolefin object obtained by converting a solution or a melt of a linear polyolefin with a weight average molecular weight of at least 400,000 g/mol into shape, at a temperature above the dissolution temperature or above the melting temperature, respectively, cooling this to form a solid, gel-like object and stretching this object at increased temperature, whether or not after complete or partial removal of solvent.

3. Process according to claim 1, wherein an alkoxy substituted silane compound is used as the silane compound.

4. Process according to claim 3, wherein 3-aminopropyltriethoxy silane is used.

5. Process according to claim 1, wherein said solution contains 0.05-20 wt % of a silane compound based on the total weight of the solution.

6. Process according to claim 1, wherein said solution includes a polar solvent such as water, a lower aliphatic ketone, alcohol or carboxylic ester.

7. Process according to claim 1, wherein the polyolefin object is contacted with such an amount of a silane compound that between $1\times10^{-4}$ and $20\times10^{-4}$ mg of compound is applied to the object per $cm^2$ of surface area.

8. Process according to claim 1, wherein a polyolefin filament, tape or film is used as the polyolefin object.

9. Process according to claim 1, wherein the polyolefin object is a polyethylene filament which has been obtained by ultradrawing gel filaments spun from a solution and which has a tensile strength of more than 2 GPa and a modulus of more than 50 GPa.

* * * * *